United States Patent
Wada

(10) Patent No.: US 6,809,355 B2
(45) Date of Patent: Oct. 26, 2004

(54) SOLID-STATE IMAGING DEVICE

(75) Inventor: Kazushi Wada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/822,647

(22) Filed: Mar. 30, 2001

(65) Prior Publication Data

US 2001/0052636 A1 Dec. 20, 2001

(30) Foreign Application Priority Data

Mar. 31, 2000 (JP) .................................... P2000-096963

(51) Int. Cl.$^7$ ..................... H01L 27/148; H01L 29/768
(52) U.S. Cl. ......................... 257/222; 257/40; 257/79; 257/80; 257/83; 257/113; 257/114; 257/115; 257/116; 257/117; 257/118; 257/431; 257/435; 257/436; 257/223; 257/659; 257/660; 257/758
(58) Field of Search .................. 257/40, 79, 80, 257/83, 113–118, 431–432, 435–436, 222–223, 659–660, 758

(56) References Cited

U.S. PATENT DOCUMENTS

| | | | | |
|---|---|---|---|---|
| 4,143,389 A | * | 3/1979 | Koike et al. | 257/292 |
| 4,364,973 A | * | 12/1982 | Koike et al. | 427/75 |
| 4,467,341 A | * | 8/1984 | Suzuki | 257/230 |
| 4,641,169 A | * | 2/1987 | Inuiya | 257/444 |
| 4,694,317 A | * | 9/1987 | Higashi et al. | 257/446 |
| 4,875,101 A | * | 10/1989 | Endo et al. | 348/314 |
| 5,140,397 A | * | 8/1992 | Haga et al. | 257/53 |
| 5,158,619 A | * | 10/1992 | Kawada et al. | 136/263 |
| 5,187,369 A | * | 2/1993 | Kingsley et al. | 250/370.11 |
| 5,343,061 A | * | 8/1994 | Yamashita et al. | 257/229 |
| 5,463,232 A | * | 10/1995 | Yamashita et al. | 257/223 |
| 5,504,526 A | * | 4/1996 | Miyagawa et al. | 348/313 |
| 5,621,461 A | * | 4/1997 | Higashide | 348/302 |
| 5,684,312 A | * | 11/1997 | Yonemoto | 257/291 |
| 5,773,859 A | * | 6/1998 | Ueno | 257/294 |
| 5,798,542 A | * | 8/1998 | Anagnostopoulos et al. | 257/232 |
| 5,847,381 A | * | 12/1998 | Isogai | 250/208.1 |
| 5,851,881 A | * | 12/1998 | Lin et al. | 438/261 |
| 5,898,195 A | * | 4/1999 | Harada | 257/223 |
| 5,956,570 A | * | 9/1999 | Takizawa | 438/60 |
| 6,407,415 B2 | * | 6/2002 | Lee | 257/215 |
| 6,512,547 B1 | * | 1/2003 | Miida | 348/310 |
| 6,627,929 B2 | * | 9/2003 | Shim et al. | 257/292 |
| 2002/0005819 A1 | * | 1/2002 | Ronzani et al. | 345/8 |
| 2002/0025597 A1 | * | 2/2002 | Matsuda | 438/57 |
| 2003/0173582 A1 | * | 9/2003 | Hatano et al. | 257/184 |

* cited by examiner

*Primary Examiner*—Michael Trinh
*Assistant Examiner*—Ida M. Soward
(74) *Attorney, Agent, or Firm*—Sonnenschein, Nath & Rosenthal LLP

(57) ABSTRACT

A solid-state imaging device having a gate structure including an oxide film and a nitride film includes upper layer films (for example, a planarization film, an insulating film, and a protective film) allowing ultraviolet rays having a wavelength of 400 nm or less to pass therethrough; and a metal made shield film or an organic film capable of absorbing the ultraviolet rays formed in such a manner as to cover a region of the gate structure (for example, an output gate and a reset gate), excluding a light receiving portion and a transfer portion, of the solid-state imaging device. With this configuration, it is possible to prevent the shift of a threshold voltage Vth, and hence to enhance the reliability of the transfer or reset of electric charges.

3 Claims, 4 Drawing Sheets

SOLID-STATE IMAGING DEVICE

RELATED APPLICATION DATA

The present application claims priority to Japanese Application No. P2000-096963 filed Mar. 31, 2000, which application is incorporated herein by reference to the extent permitted by law.

BACKGROUND OF THE INVENTION

The present invention relates to a solid-state imaging device, and particularly to a solid-state imaging device in which a transistor region excluding a light receiving portion and a transfer portion is shielded.

It is known that an MONOS (Metal Oxide Nitride Oxide Semiconductor) gate structure portion in which a gate electrode is formed on a silicon substrate via a gate insulating film composed of a stack of a silicon oxide film, a silicon nitride film, and a silicon oxide film is irradiated with ultraviolet rays, electrons in silicon migrate in the silicon nitride, whereby a threshold voltage Vth of the transistor is shifted.

In a CCD (Charge Coupled Device) solid-state imaging device, each of a light receiving portion and a transfer portion has an MONOS gate structure. The MONOS gate structure is generally shielded with a metal film for suppressing occurrence of the shift of a threshold voltage Vth.

FIG. 4 is a schematic sectional view of a configuration of a portion, extending from an output end of a horizontal transfer register to an output portion, of a related art solid-state imaging device.

Referring to FIG. 4, a gate insulating film 120 having a stack structure of a silicon oxide film 121, a silicon nitride film 122, and a silicon oxide film 123 is formed on a silicon substrate 111. In a horizontal transfer register portion 112 of the solid-state imaging device, first transfer electrodes 131 made from polysilicon and second transfer electrodes 132 made from polysilicon are alternately formed on the gate insulating film 120.

An output portion 113 is formed at the end of the horizontal transfer register portion 112. In this output portion 113, an output gate 141 and a reset gate 142 are formed on the gate insulating film 120. A floating diffusion portion (hereinafter, referred to as "FD portion") 143 is formed in a portion, between the output gate 141 and the reset gate 142, of the silicon substrate 111. A reset drain 144 is formed in a portion, on the side opposed to the FD portion 143 with respect to the reset gate 142, of the silicon substrate 111.

A planarization film 151 is formed on the silicon substrate 111 in such a manner as to cover the above-described elements. A FD electrode 145 connected to the FD portion 143, and a reset drain electrode 146 connected to the reset drain 144 are formed on the planarization film 151. A shield film 155 made from aluminum is formed on the planarization film 151 in such a manner as to be cover the transfer electrodes 131 and 132. A protective film 161 is formed on the planarization film 151 in such a manner as to cover the electrodes 145 and 146 and the shield film 155.

In the CCD solid-state imaging device having the above configuration, the output gate 141 as the final transfer portion of the horizontal register and the reset gate 142 are not covered with the shield film. For a CCD solid-state imaging device used for a video camera or an electronic still camera, however, there does not occur a problem associated with the shift of a threshold voltage Vth due to irradiation of ultraviolet rays because the protective film 161 absorbs the ultraviolet rays.

However, for a CCD solid-state imaging device of a type of giving a sensitivity in an ultraviolet region having a wavelength of, for example, 400 nm or less, since the device uses a protective film allowing ultraviolet rays to pass therethrough, the ultraviolet rays enter gates not shielded by a metal film, for example, an output gate and a reset gate. When ultraviolet rays enter an output gate and a reset gate, a threshold voltage Vth is shifted, to cause a problem that the transfer and reset of electric charges cannot be performed.

SUMMARY OF THE INVENTION

An object of the present invention is to provide a solid-state imaging device capable of preventing ultraviolet rays from entering a region of an MONOS gate structure, excluding a light receiving portion and a transfer portion, of the solid-state imaging device, thereby preventing the shift of a threshold voltage Vth and enhancing the reliability of the transfer or reset of electric charges.

To achieve the above object, according to an aspect of the present invention, there is provided a solid-state imaging device having a gate structure including an oxide film and a nitride film, including: upper layer films allowing ultraviolet rays having a wavelength of 400 nm or less to pass therethrough; and a metal made shield film formed in such a manner as to cover a region of the gate structure including an oxide film and a nitride film, excluding a light receiving portion and a transfer portion, of the solid-state imaging device.

According to another aspect of the present invention, there is provided a solid-state imaging device having a gate structure including an oxide film and a nitride film, including: upper layer films allowing ultraviolet rays having a wavelength of 400 nm or less to pass therethrough; and an organic film capable of absorbing the ultraviolet rays, the organic film being formed in such a manner as to cover a region of the gate structure including an oxide film and a nitride film, excluding a light receiving portion and a transfer portion, of the solid-state imaging device.

With these configurations, since the metal made shield film or the organic film capable of absorbing ultraviolet rays is provided to cover an MONOS gate structure region, excluding a light receiving portion and a transfer portion, of the solid-state imaging device, it is possible to prevent ultraviolet rays from entering the MONOS gate structure excluding the light receiving portion and transfer portion, for example, an output gate and a reset gate. As a result, it is possible to prevent the deterioration of the solid-state imaging device and hence to improve the reliability of the solid-state imaging device.

DETAILED DESCRIPTION OF THE PREFERRED EMBODIMENT

Hereinafter, preferred embodiments of the present invention will be described with reference to the drawings.

Figure 1A:
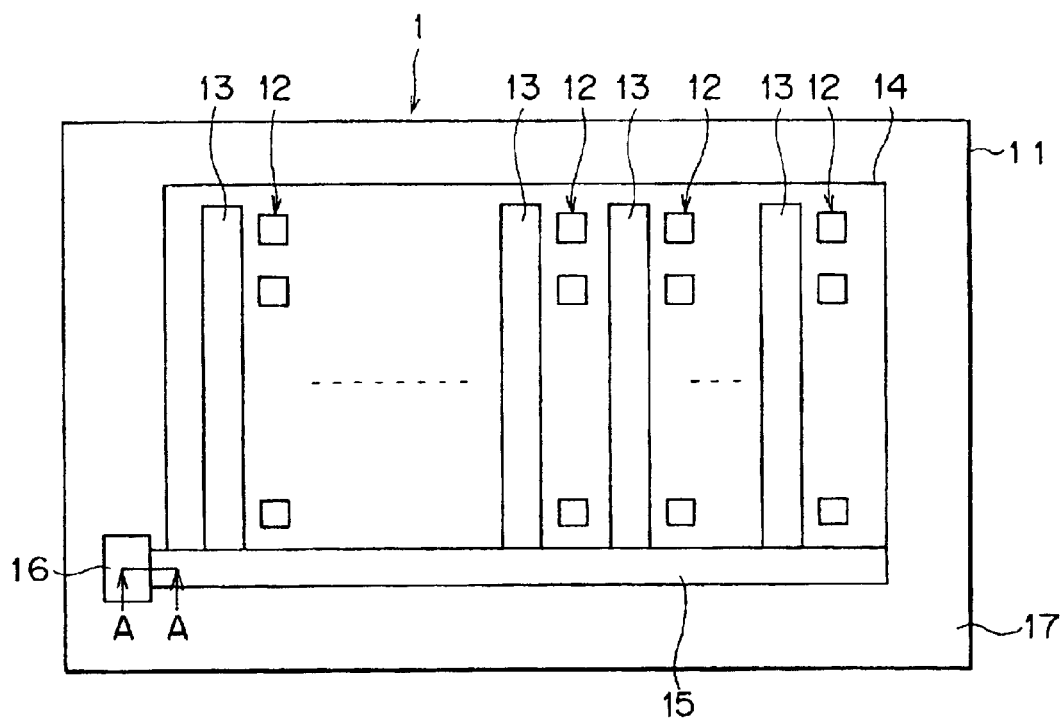
FIG. 1A is a schematic view of a configuration of a first embodiment of a solid-state imaging device according to the present invention.
Figure 1B:
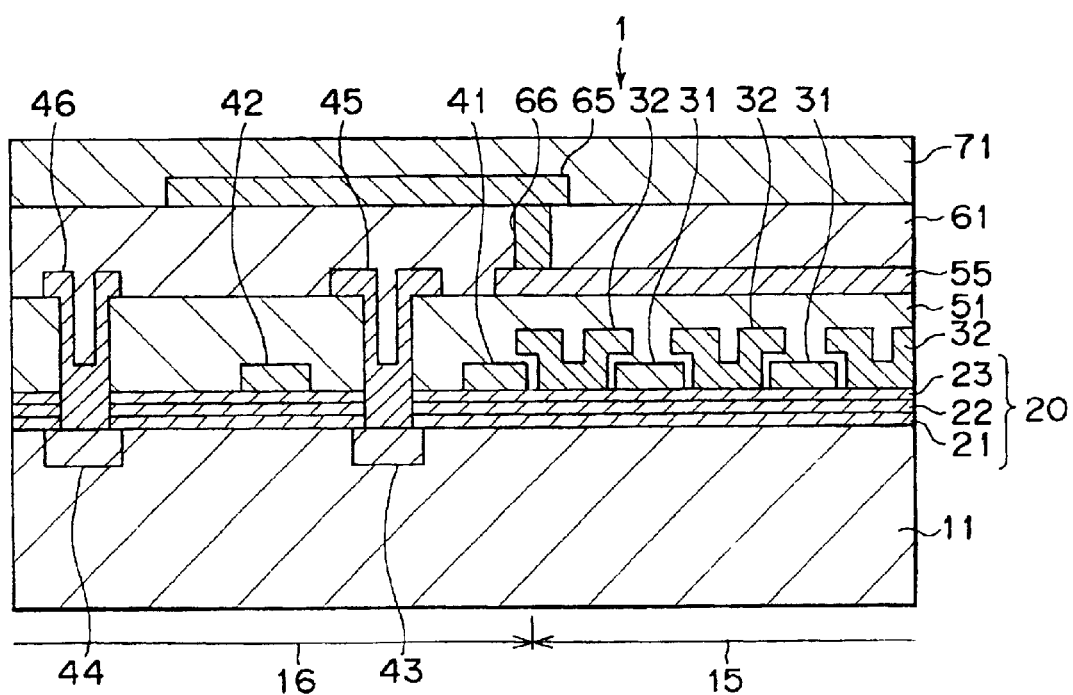
FIG. 1B is a schematic sectional view taken on line A—A of FIG. 1A.

FIG. 1A is a schematic view of a configuration of a first embodiment of a solid-state imaging device of the present invention, and FIG. 1B is a schematic sectional view taken on line A—A of FIG. 1A.

Referring to FIG. 1A, there is shown a first solid-state imaging device (CCD solid-state imaging device) 1 as the first embodiment of the present invention, which is configured by forming, on a silicon substrate 11, an imaging region 14, a horizontal transfer register 15, an output portion 16, and a peripheral region 17. The imaging region 14 is composed of a plurality of photosensors 12 for photoelectric transfer, which are arranged in a matrix pattern, and a plurality of vertical transfer registers 13 each having a CCD structure, which correspond to a row of the photosensors 12. The horizontal transfer register 15, which has a CCD structure, is formed at one end of the imaging region 14 for transferring signal charges from the imaging region 14 to the output portion 16. The output portion 16 is connected to the final stage of the horizontal transfer register 15. Bus lines and the like are formed in the peripheral region 17.

FIG. 1B shows a schematic cross-section of a configuration of a region (shown by line A—A of FIG. 1A), extending from the output end of the horizontal transfer register 15 to the output portion 16, of the first solid-state imaging device 1.

Referring to FIG. 1B, a gate insulating film 20 having a stack structure of a silicon oxide film 21, a silicon nitride film 22, and a silicon oxide film 23 is formed on a silicon substrate 11. In the horizontal transfer register portion 15 of the solid-state imaging device 1, first transfer electrodes 31 made from polysilicon and second transfer electrodes 32 made from polysilicon are alternately formed on the gate insulating film 20.

The output portion 16 is formed at the end of the horizontal transfer register portion 15. In this output portion 16, an output gate 41 and a reset gate 42 are formed on the gate insulating film 20. A floating diffusion portion (hereinafter, referred to as "FD portion") 43 is formed in a portion, between the output gate 41 and the reset gate 42, of the silicon substrate 11. A reset drain 44 is formed in a portion, on the side opposed to the FD portion 43 with respect to the reset gate 42, of the silicon substrate 11.

A planarization film 51 is formed on the silicon substrate 11 in such a manner as to cover the above-described elements. A FD electrode 45 connected to the FD portion 43, and a reset drain electrode 46 connected to the reset drain 44 are formed on the planarization film 51. A first shield film 55 is formed on the planarization film 51 in such a manner as to cover the horizontal transfer register 15. An insulating film 61 is formed on the planarization film 51 in such a manner as to cover the electrodes 45 and 46 and the first shield film 55. Each of the planarization film 51 and the insulating film 61 is formed of a film allowing ultraviolet rays to pass therethrough.

A second shield film 65 for shielding the MONOS gates (for example, the output gate 41 and the reset gate 42) of the output portion 16 is formed on the insulating film 61 which has been formed to cover the FD electrode 45, reset electrode 46, and first shield film 55. Each of the first and second shield films 55 and 56 is made from, for example, aluminum or an aluminum alloy. A protective film 71 is formed on the insulating film 61 in such a manner as to cover the second shield film 65. The protective film 71 is formed of a film allowing ultraviolet rays to pass therethrough. Accordingly, in the first solid-state imaging device 1, the upper layer films composed of the planarization film 51, insulating film 61, and protective film 71 are all formed of the films allowing ultraviolet rays to pass therethrough.

In the first solid-state imaging device 1, since ultraviolet rays do not enter the MONOS gate portion by the presence of the first and second shield films 55 and 65, there does not occur the shift of a threshold voltage Vth. Here, a potential of the second shield film 65 may be fixed to the GND by connecting the second shield film 65 via a plug 66 to the first shield film 55 for shielding the horizontal transfer register 15, or be kept in a floating state without forming the plug 66.

Since the second shield film 65 as the metal made shield film is provided on a region of the MONOS gate structure (for example, the output gate 41 and reset gate 42), excluding the light receiving portion and the transfer portion, of the first solid-state imaging device 1, it is possible to prevent ultraviolet rays from entering the MONOS structure region (for example, the output gate 41 and reset gate 42), excluding the light receiving portion and the transfer portion, of the first solid-state imaging device 1, and hence to prevent the shift of a threshold voltage Vth of the MONOS gates due to irradiation of ultraviolet rays. This makes it possible to prevent the deterioration of the solid-state imaging device.

Figure 2:
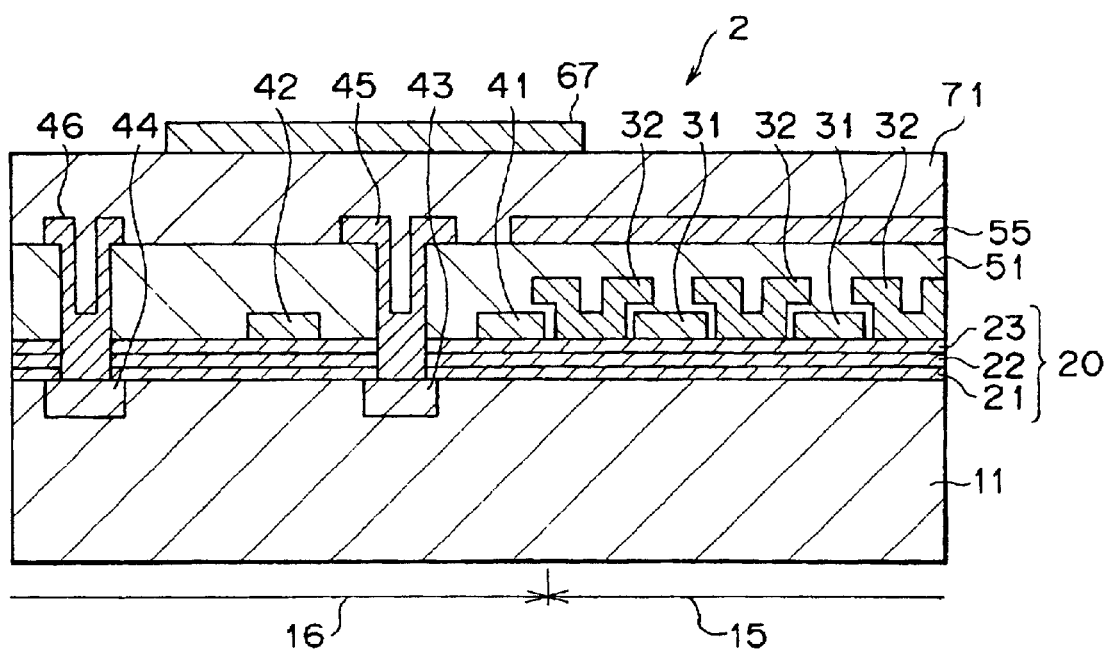
FIG. 2 is a schematic sectional view of a configuration of a second embodiment of a solid-state imaging device according to the present invention.

FIG. 2 is a schematic sectional view of a configuration of a second embodiment of the solid-state imaging device of the present invention.

A second solid-state imaging device 2 as the second embodiment shown in FIG. 2 has the same basic configuration as that of the first solid-state imaging device 1 shown in FIGS. 1A and 1B, except that an organic film for absorbing ultraviolet rays is used in place of the metal made shield film. The organic film may be made from a colored resist. Preferably, the colored resist has an ability of absorbing 95% or more of ultraviolet rays having a wavelength of 400 nm or less. Further, the absorbance of the organic film may be determined based on a combination of a material of an organic film and a film thickness.

Next, a schematic configuration of a portion, extending from the output end of a horizontal transfer register to an output portion, of the second solid-state imaging device 2 will be described with reference to FIG. 2.

Referring to FIG. 2, a gate insulating film 20 having a stack structure of a silicon oxide film 21, a silicon nitride film 22, and a silicon oxide film 23 is formed on a silicon substrate 11. In a horizontal transfer register portion 15 of the solid-state imaging device 2, first transfer electrodes 31 made from polysilicon and second transfer electrodes 32 made from polysilicon are alternately formed on the gate insulating film 20.

An output portion 16 is formed at the end of the horizontal transfer register portion 15. In this output portion 16, an output gate 41 and a reset gate 42 are formed on the gate insulating film 20. A floating diffusion portion (hereinafter, referred to as "FD portion") 43 is formed in a portion, between the output gate 41 and the reset gate 42, of the silicon substrate 11. A reset drain 44 is formed in a portion, on the side opposed to the FD portion 43 with respect to the reset gate 42, of the silicon substrate 11.

A planarization film 51 is formed on the silicon substrate 11 in such a manner as to cover the above-described elements. A FD electrode 45 connected to the FD portion 43, and a reset drain electrode 46 connected to the reset drain 44 are formed on the planarization film 51. The planarization film 51 is formed of a film allowing ultraviolet rays to pass therethrough. A first shield film 55 made from, for example, aluminum is formed on the planarization film 51 in such a manner as to cover the horizontal transfer register 15. A protective film 71 is formed on the planarization film 51 in such a manner as to cover the FD electrode 45, reset electrode 46, and first shield film 55. The protective film 71 is also formed of a film allowing ultraviolet rays to pass therethrough. Accordingly, in the second solid-state imaging device 2, the upper layer films composed of the planarization film 51 and protective film 71 are all formed of the films allowing ultraviolet rays to pass therethrough.

A second shield film 67 for shielding MONOS gates (for example, output gate 41 and reset gate 42) of the output portion 16 is formed on the protective film 71. The second shield film 67 is formed of an organic film capable of absorbing ultraviolet rays.

Since the second shield film 67 formed of the organic film capable of absorbing ultraviolet rays is provided on a region of the MONOS gate structure (for example, the output gate 41 and reset gate 42), excluding the light receiving portion and the transfer portion, of the second solid-state imaging device 2, it is possible to prevent ultraviolet rays from entering the MONOS gate structure region (for example, the output gate 41 and reset gate 42), excluding the light receiving portion and the transfer portion, of the second solid-state imaging device 2, and hence to prevent the shift of a threshold voltage Vth of the MONOS gates due to irradiation of ultraviolet rays. This makes it possible to prevent the deterioration of the solid-state imaging device.

Further, in the second solid-state imaging device 2, since the second shield film 67 formed over the FD portion 41 is the organic film having no electric conductivity, an increase in parasitic capacitance can be suppressed. By forming the second shield film 67 from a colored resist, it is possible to form an ultraviolet ray shielding structure capable of suppressing a parasitic capacitance without significantly increasing the number of production steps.

Figure 3A:
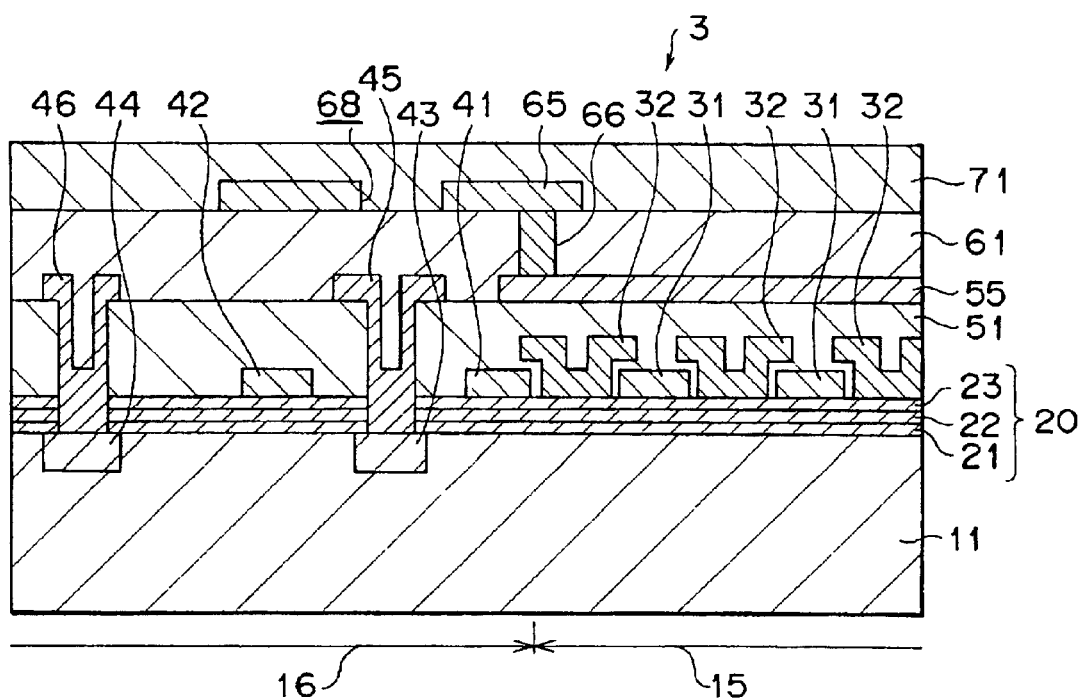
FIG. 3A is a schematic sectional view of a configuration of a third embodiment of a solid-state imaging device according to the present invention.
Figure 3B:
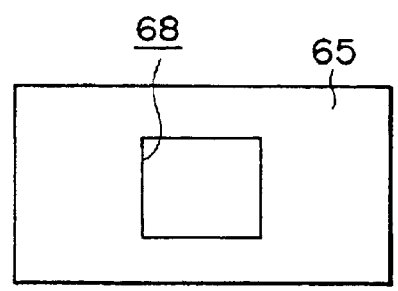
FIG. 3B is a plan view of a second shield film of the solid-state imaging device shown in FIG. 3A.
Figure 4:
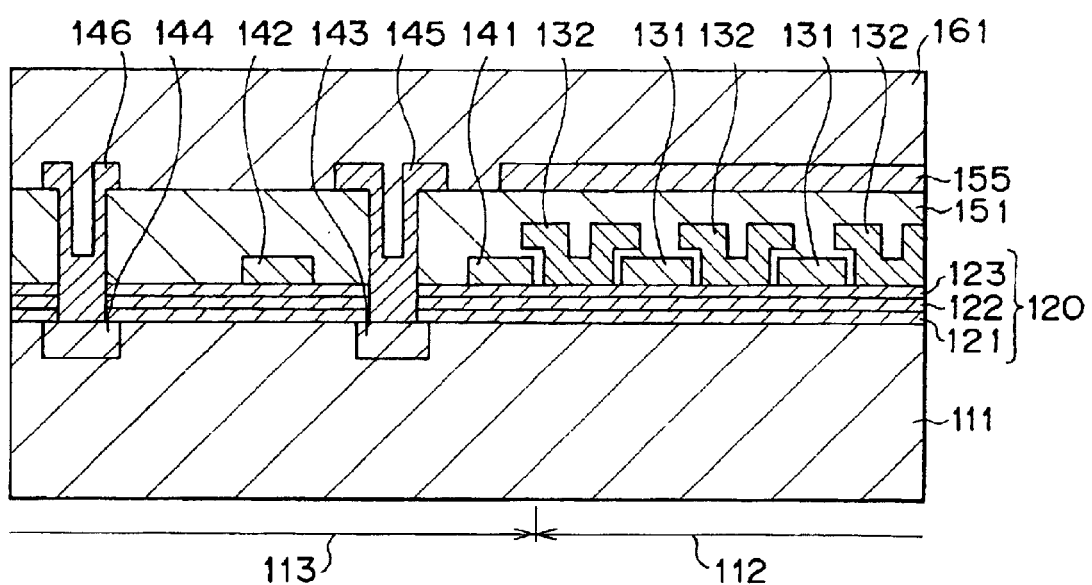
FIG. 4 is a schematic sectional view of a configuration of an essential portion of a related art solid-state imaging device.

FIG. 3A is a schematic sectional view of a configuration of a third embodiment of the solid-state imaging device according to the present invention, and FIG. 3B is a plan view of a second shield film of the solid-state imaging device shown in FIG. 3A.

A third solid-state imaging device 3 as the third embodiment shown in FIG. 3A has the same basic configuration as that of the first solid-state imaging device 1 shown in FIGS. 1A and 1B, except that a second shield film 65 has an opening 68 at a position directly over a FD portion 43. The size of the opening 68 formed in the second shield film 65 is set to be within such a range as not to allow light having passed through the opening 68 to enter MONOS gates (for example, an output gate 41 and reset gate 42).

The third solid-state imaging device 3 includes the same components as those of the first solid-state imaging device 1 shown in FIGS. 1A and 1B, excluding the second shield film 65. That is to say, a gate insulating film 20 having a stack structure of a silicon oxide film 21, a silicon nitride film 22, and a silicon oxide film 23 is formed on a silicon substrate 11. In a horizontal transfer register portion 15 of the third solid-state imaging device 3, first transfer electrodes 31 made from polysilicon and second transfer electrodes 32 made from polysilicon are alternately formed on the gate insulating film 20. An output portion 16 is formed at the end of the horizontal transfer register portion 15. In this output portion 16, an output gate 41 and a reset gate 42 are formed on the gate insulating film 20. A FD portion 43 is formed in a portion, between the output gate 41 and the reset gate 42, of the silicon substrate 11. A reset drain 44 is formed in a portion, on the side opposed to the FD portion 43 with respect to the reset gate 42, of the silicon substrate 11. A planarization film 51 is formed on the silicon substrate 11. A FD electrode 45 connected to the FD portion 43, and a reset drain electrode 46 connected to the reset drain 44 are formed on the planarization film 51. A first shield film 55 is formed on the planarization film 51, and an insulating film 61 is formed on the planarization film 51. A second shield film 65 is formed on the insulating film 61. The first shield film 55 is connected to the second shield film 65 via a plug 66. A protective film 71 is formed on the insulating film 61. In addition, the upper layer films composed of the planarization film 51, insulating film 61, and protective film 71 are all formed of the films allowing ultraviolet rays to pass therethrough.

In the third solid-state imaging device 3, since the opening 68 is formed in the second shield film 65, the parasitic capacitance at the FD portion 43 is made small as compared with the first solid-state imaging device 1 shown in FIGS. 1A and 1B, with a result that the reduction in photoelectric transfer efficiency is suppressed.

While the preferred embodiments of the present invention have been described using the specific terms, such description is for illustrative purposes only, and it is to be understood that changes and variations may be made without departing from the spirit or scope of the following claims.

What is claimed is:

1. A solid-state imaging device having an output portion connected to an output end of a horizontal transfer register, the output portion having a gate structure including an oxide film and a nitride film, the solid-state imaging device comprising:

upper layer films allowing ultraviolet rays having a wavelength of 400 nm or less to pass therethrough;

a first metal made shield film covering a region of said gate structure including the oxide film and the nitride film, the first metal made shield film being disposed above a light receiving portion and a transfer portions of said solid-state imaging device; and a second metal made shield flim covering a region of said gate structure including the oxide film and the nitride film, the second metal made shield film entirely shielding at least one of an output gate and a reset gate in the output portion, of said solid-state imaging device, the second metal made shield film not being disposed above the light receiving portion.

2. A solid-state imaging device according to claim 1, wherein said second metal made shield film has an opening at a position directly over a floating diffusion region of said solid-state imaging device.

3. A solid-state imaging device having an output portion connected to an output end of a horizontal transfer register, the output portion having a gate structure including an oxide film and a nitride film, the solid-state imaging device comprising:

upper layer films allowing ultraviolet rays having a wavelength of 400 nm or less to pass therethrough; and an organic film capable of absorbing said ultraviolet rays, said organic film covering a region of said gate structure including the oxide film and the nitride film, the organic film entirely shielding at least one of an output gate and a reset gate in the output portion, of said solid-state imaging device, the organic film not being disposed above a light receiving portion of the solid-state imagine device.

* * * * *